US010209325B2

(12) United States Patent
Rothgang et al.

(10) Patent No.: US 10,209,325 B2
(45) Date of Patent: Feb. 19, 2019

(54) MAGNETIC RESONANCE IMAGING COIL WITH ADJUSTABLE OPENING

(71) Applicants: Siemens Healthcare GmbH, Erlangen (DE); The Johns Hopkins University, Baltimore, MD (US)

(72) Inventors: Eva Rothgang, Nürnberg (DE); Volker Matschl, Bamberg (DE); Arne Hengerer, Möhrendorf (DE); Lars Lauer, Neunkirchen (DE); Wesley David Gilson, Northbeach, MD (US); Jonathan Lewin, Atlanta, GA (US); Jan Fritz, Baltimore, MD (US); Clifford Weiss, Baltimore, MD (US); Katarzyna Macura, Catonsville, MD (US); Paul Bottomley, Columbia, MD (US)

(73) Assignees: Siemens Healthcare GmbH, Erlangen (DE); The Johns Hopkins University, Baltimore, MD (US)

( * ) Notice: Subject to any disclaimer, the term of this patent is extended or adjusted under 35 U.S.C. 154(b) by 395 days.

(21) Appl. No.: 15/056,134

(22) Filed: Feb. 29, 2016

(65) Prior Publication Data
US 2017/0248666 A1    Aug. 31, 2017

(51) Int. Cl.
*G01R 33/34*    (2006.01)
*G01R 33/28*    (2006.01)
*G01R 33/3415*    (2006.01)

(52) U.S. Cl.
CPC ... *G01R 33/34007* (2013.01); *G01R 33/3415* (2013.01); *G01R 33/34084* (2013.01); *G01R 33/285* (2013.01)

(58) Field of Classification Search
CPC .......... G01R 33/3415; G01R 33/34084; G01R 33/340007; G01R 33/34; G01R 33/34092
See application file for complete search history.

(56) References Cited

U.S. PATENT DOCUMENTS

| 2005/0253582 A1* | 11/2005 | Giaquinto | G01R 33/3415 324/318 |
| 2007/0040555 A1* | 2/2007 | Wohlfarth | G01R 33/3415 324/318 |
| 2007/0159170 A1* | 7/2007 | Freytag | G01R 33/34069 324/318 |
| 2007/0188175 A1* | 8/2007 | Burdick, Jr. | G01R 33/34007 324/322 |

(Continued)

FOREIGN PATENT DOCUMENTS

WO    2014208501 A1    12/2014

*Primary Examiner* — Ruifeng Pu

(57) ABSTRACT

A configurable coil arrangement for use with MRI-guided procedures is provided that facilitates optimal imaging for both pre-procedure planning and imaging of the target sites during the procedure. The coil arrangement includes a plurality of connected coil elements. Spacers connecting the coil elements can be adjustable and/or deformable to provide one or more openings in the coil arrangement of optimal size for accessing the subject within the imaged region. Individual coil elements can also be removed to provide access openings during such procedures, or left in the array for improved pre- and post-procedure image quality. The MRI system can be configured to detect configurations of the coil arrangement and modify imaging parameters to optimize image quality.

18 Claims, 6 Drawing Sheets

(56) References Cited

U.S. PATENT DOCUMENTS

| | | | |
|---|---|---|---|
| 2008/0174314 A1* | 7/2008 | Holwell | G01R 33/34046 324/318 |
| 2011/0121830 A1* | 5/2011 | Ma | G01R 33/34007 324/318 |
| 2013/0137969 A1* | 5/2013 | Jones | A61B 5/055 600/421 |
| 2013/0184566 A1* | 7/2013 | Kreischer | G01R 33/34084 600/422 |
| 2014/0247050 A1* | 9/2014 | Tomiha | G01R 33/34092 324/322 |
| 2016/0135711 A1* | 5/2016 | Dohata | A61B 5/0555 600/422 |
| 2017/0248666 A1* | 8/2017 | Rothgang | G01R 33/34 |
| 2018/0017643 A1* | 1/2018 | Zink | G01R 33/34084 |

\* cited by examiner

PRIOR ART

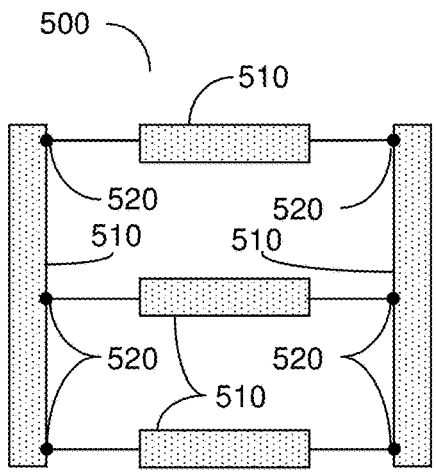
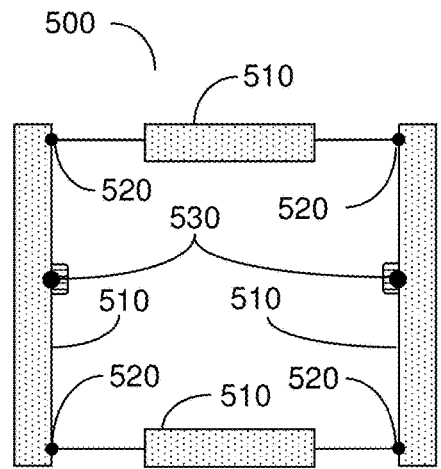
FIG. 5A  FIG. 5B
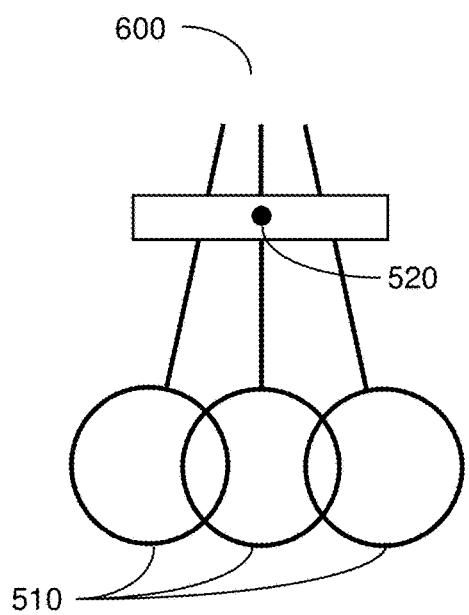
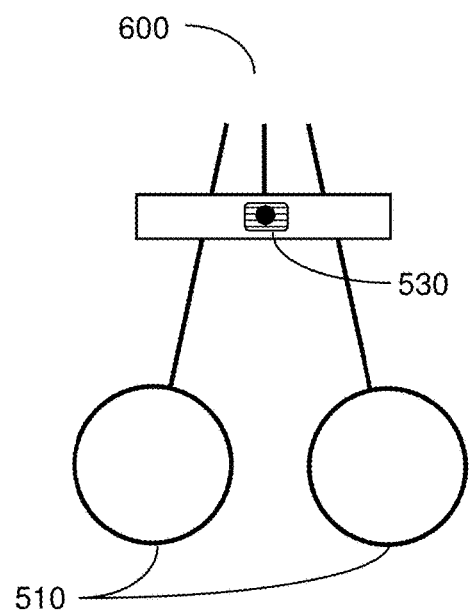
FIG. 6A  FIG. 6B

MAGNETIC RESONANCE IMAGING COIL WITH ADJUSTABLE OPENING

FIELD OF THE DISCLOSURE

The present disclosure relates to a magnetic resonance imaging (MRI) coil arrangement having a flexible or variable opening size or configuration that can facilitate improved image quality and instrument placement, e.g., for MRI-guided procedures.

BACKGROUND INFORMATION

Image-guided procedures are medical procedures that require precise insertion or placement of an object within a subject. Such procedures (also referred to as 'interventions') are often percutaneous interventions, and the inserted object can include, for example, a catheter, an electrode, a needle, or the like. Percutaneous interventions can be used for biopsies, thermal ablations, infiltrations, etc. of a target structure. Imaging techniques for such procedures can include, e.g., ultrasound, x-ray, or magnetic resonance (MR) imaging. For safe and accurate needle placement, continuous visualization of the target, surrounding sensitive structures, and the inserted object (e.g. a needle) is essential.

MR imaging provides many advantages in such procedures, including absence of ionizing radiation or other potentially harmful energy, ability to generate images from different angles/planes, etc. When MRI is used, a body coil is usually not sufficient for imaging the insertion and target volume because of lack of detail/resolution. Accordingly, local coils or coil arrays are often used to obtain more detailed imaging of the insertion and target regions. For example, such coils or arrays typically include one or more coils that are substantially coplanar, and include one or more openings that facilitate placement of needles or the like therethrough while the coil/array remains positioned in a fixed location, e.g., on or close to the subject's skin. Certain interventions may include insertion of two or more needles or similar objects, and the coil/array openings must be able to accommodate such object placements. Each coil/array opening should be of sufficient size to allow alignment of the needle/object in a plurality of angles and to allow for a sterile field around the needle entry point which is not broken by the usually non-sterile coil.

A standard MR coil array used for diagnostic imaging is shown in FIG. 1A. This array (which includes 6 elements) includes four openings near the four corners of this rectangular array. The openings in such imaging coil arrays typically are not large enough to be used effectively for MRI-guided interventions.

A simple loop coil (covered by sterile drapes) that can be used in MRI-guided procedures is shown in FIG. 1B. A point of entry for the planned needle insertion is shown by the arrow in this figure. Although the coil opening is large, such loop coils often do not provide sufficient image quality for accurate guidance and placement of a needle or other object during the intervention.

A schematic side-view illustration of a conventional intervention procedure is shown in FIG. 2. In this illustration, a loop coil 210 is placed on the subject 210. The loop coil 210, in communication with an MRI system (not shown), can provide good image quality in the volume beneath the coil 210 denoted by dashed lines. Two target sites 240 within the subject 220 are also shown. During the MR-guided procedure, a needle 230 can be directed to each of the target sites 240. In FIG. 2, the needle 230 is being directed to a particular target site 240 that lies just outside the volume imaged buy the coil 210. Accordingly, the visualization of the needle advancement will be poorer as the needle 230 approaches this target site 240. Such fixed coil sizes can thus be undesirable in certain guided procedures, e.g., where insertion angles may vary and some such angles may be oblique.

The selection and design of an imaging coil arrangement for MRI-guided procedures thus can present a compromise between image quality and robustness of insertion access through provided openings in the coil(s). Further, maintaining a sterile field can be challenging when multiple needles or objects are placed during an intervention. Additionally, the preferred or necessary size of the coil opening(s) can vary significantly between different procedures, and may also be dependent on the number of needles that need to be placed.

Accordingly, it would be desirable to have a coil arrangement for MRI-guided procedures that addresses the shortcomings described above.

SUMMARY OF EXEMPLARY EMBODIMENTS

Exemplary embodiments of the present disclosure can provide MR imaging coil arrangements that include variable opening sizes, which can be adapted to different intervention procedures, provide adequate access to the subject for percutaneous insertion of needles and the like, and also provide sufficient image quality for diagnostic planning and guidance before and during the intervention.

In certain embodiments, a coil arrangement can be provided that includes a plurality of coil elements that are interconnected by a plurality of variable spacers. The coil elements can be provided in a triangular, square, rectangular, trapezoidal, or other geometrical configuration. In another embodiment, the coil elements can be connected in an interlocking configuration.

The individual coil elements can all be the same size and shape, and have the same radio frequency (RF) properties. In further embodiments, different ones of the coil elements can have different sizes, shapes, and/or RF properties.

The variable spacers can include conductive elements therein that conduct signals detected by the coil elements to an MRI system. In further embodiments, the conductive elements can also conduct electrical signals between or among two or more of the coil elements. The variable spacers can be pivotally or flexibly coupled to the coil elements to facilitate arbitrary adjustment of the coil elements with respect to one another.

In one embodiment, the variable spacers can be structured as deformable rods or tubes that can be bent to desired shapes and maintain those shapes when the coil arrangement is being used. In further embodiments, the variable spacers can include two or more slidably engaged or coupled segments that facilitate movement of the ends of the coil structures affixed to the rail elements. These slidable rail elements can be provided with frictional resistance to facilitate manual positioning of the slidable rail elements in a particular location with respect to one another, such that the coil elements coupled thereto can be configured in a desired geometry that can be maintained during use of the coil arrangement. In a further embodiment, the slidable rail elements can be provided with a plurality of locking "stops" that can hold the variable spacers at any one of several particular lengths.

In a still further embodiment, the variable spacers can include two or more rigid segments that are pivotally or rotatably connected by one or more frictional or lockable hinges.

In certain embodiments, the coil arrangement is substantially planar. In further embodiments, the coil arrangement can be adjustable to allow a degree of out-of-plane deformation, e.g., to conform to a surface contour of the subject.

In certain embodiments, the variable spacers can be provided with sensor elements such as, e.g., gauges, length and/or angle indicators, or other types of sensors that quantify and/or identify the specific configuration of the coil arrangement. Such sensors can include electrical switches (e.g. micro switches), variable resistors, strain gauges, or the like, which can be structured to detect configurations of the variable spacers. An MRI system can also be provided that is configured to detect the configuration of the coil arrangement based on such sensors, and further configured to modify or adapt certain parameters of the MR imaging procedure based on such detected configuration of the coil arrangement. In further embodiments, the MRI system can be configured to modify or adapt certain parameters of the MR imaging procedure based on manual entry of a particular configuration of the coil arrangement.

In another embodiment of the disclosure, a coil arrangement can be provided that includes a plurality of coil elements, where at least one of the coil elements is connected to the other coil elements by detachable connectors. The connectors can provide structural stability for connecting or linking the coil elements, and they can also include connective couplings for conductive leads to provide an electrically conductive path among the coil elements and/or between the coil elements and the MRI apparatus. In this manner, one or more coil elements can be removed from the coil arrangement for use during MRI-guided procedures to create a central opening for needle or object insertion. Accordingly, this coil arrangement can be used for high-quality imaging for pre-intervention planning and/or post-procedure verification, and for obtaining sufficient imaging quality during the intervention to guide the insertion procedure while providing necessary access to the subject through a central opening.

Plugs can optionally be provided for connectors when one or more coil arrangements are removed, to seal the connector openings and/or protect the conductors within the connectors.

In another embodiment, the MRI system being used with the coil arrangement can be configured to detect particular configurations of the coil arrangement including, e.g., which coil arrangements are present and which have been removed, prior to each MR imaging procedure. Such detection can be based on electrical properties of the coil arrangement such as, e.g., resistivity inductance, or the like. The MRI system can be further configured to automatically modify certain parameters of the MR imaging procedure based on the detected configuration of the coil arrangement.

BRIEF DESCRIPTION OF THE DRAWINGS

Further objects, features and advantages of the present disclosure will become apparent from the following detailed description taken in conjunction with the accompanying figures showing illustrative embodiments, results and/or features of the exemplary embodiments of the present disclosure, in which:

FIGS. 5A-5B are schematic illustrations of two exemplary configurations of a coil array in accordance with further embodiments of the present disclosure; and FIGS. 6A-6B are schematic illustrations of two exemplary configurations of a coil array in accordance with still further embodiments of the present disclosure.

While the present disclosure will now be described in detail with reference to the figures, it is done so in connection with the illustrative embodiments and is not limited by the particular embodiments illustrated in the figures. It is intended that changes and modifications can be made to the described embodiments without departing from the true scope and spirit of the present invention as defined by the appended claims.

DETAILED DESCRIPTION OF EXEMPLARY EMBODIMENTS

The present disclosure relates to imaging coil arrangements that can be used with an MRI system, which include variable opening sizes that can be adapted to different intervention procedures, provide adequate access to the subject for percutaneous insertion of needles and the like, and also provide sufficient image quality for diagnostic planning and guidance before and during the intervention.

In one embodiment of the disclosure, a coil arrangement 300 can be provided, e.g., in the various configurations illustrated schematically in FIGS. 3A-3E. The exemplary coil arrangement 300 includes a plurality of coil elements 310 that are interconnected by a plurality of connective variable spacers 320. One or more conductive leads connecting this coil array 300 to the MRI apparatus are not shown in these figures.

Figure 1A:
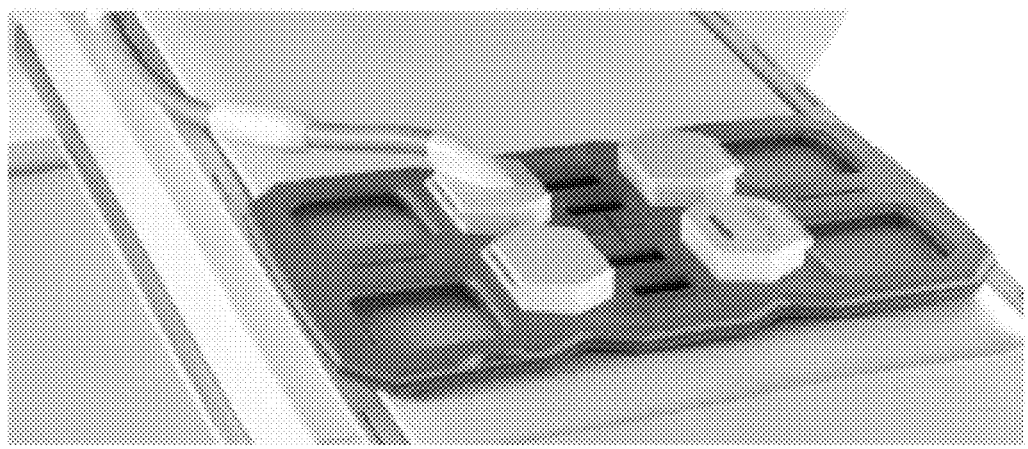
FIG. 1A is an image of a prior-art diagnostic imaging coil array that includes four access openings.
Figure 1B:
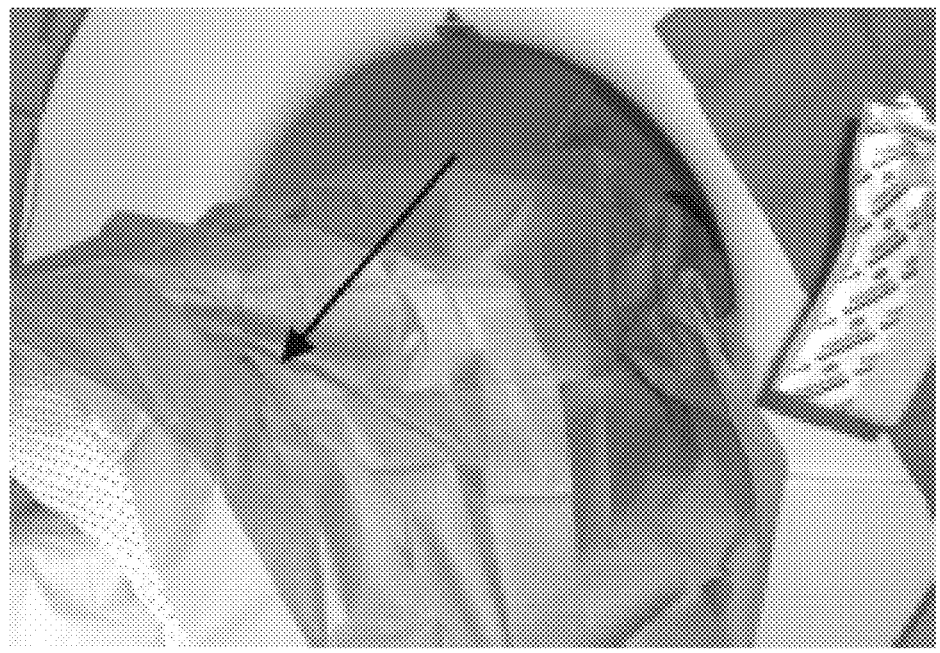
FIG. 1B is an image of a prior-art simple loop coil, covered by sterile sheets, that has a large opening to facilitate access to the subject and has a corresponding reduced image quality.
Figure 2:
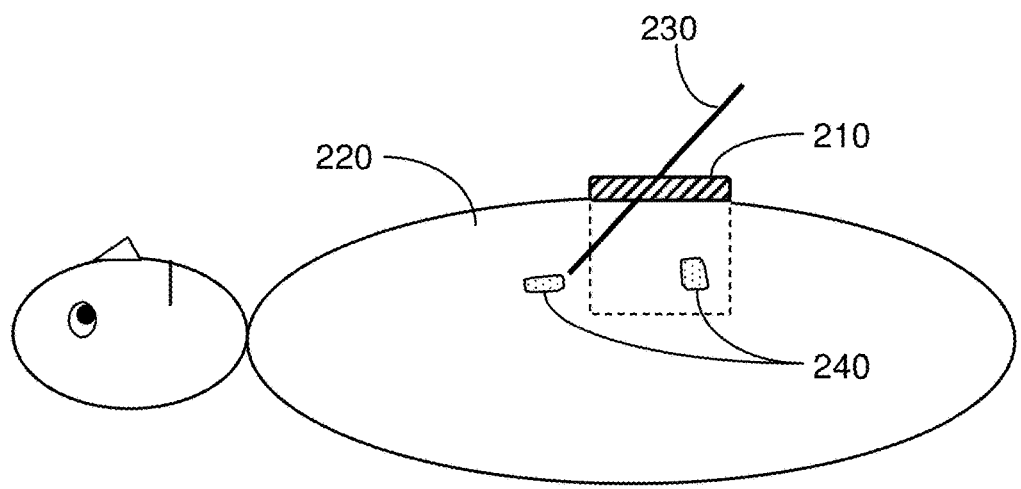
FIG. 2 is a schematic side-view illustration of an MRI-guided intervention using a simple prior-art loop coil.
Figure 3A:
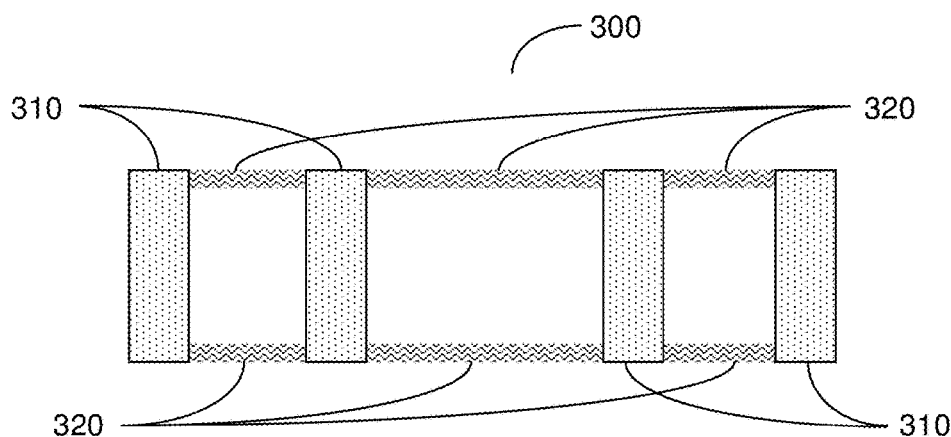
FIGS. 3A-3E are schematic illustrations of exemplary coil array configurations in accordance with embodiments of the present disclosure.
Figure 3B:
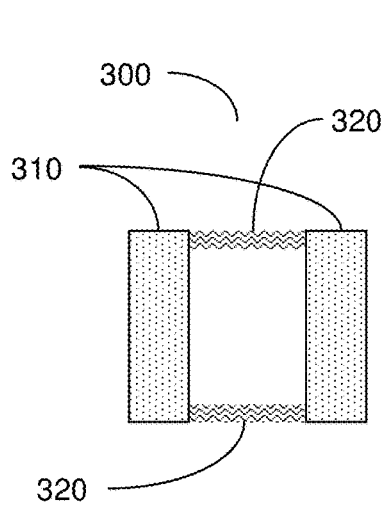

In the embodiment illustrated in FIG. 3A, there are four substantially parallel coil elements 310. In further embodiments there may be as few as two or three coil elements 310 as shown, e.g., in FIGS. 3B and 3C respectively. In further embodiments, the coil arrangement 300 can include four or five coil elements 310 as shown, e.g., in FIGS. 3D and 3E respectively. In still further embodiments there may be more than five coil elements 310.

Figure 3C:
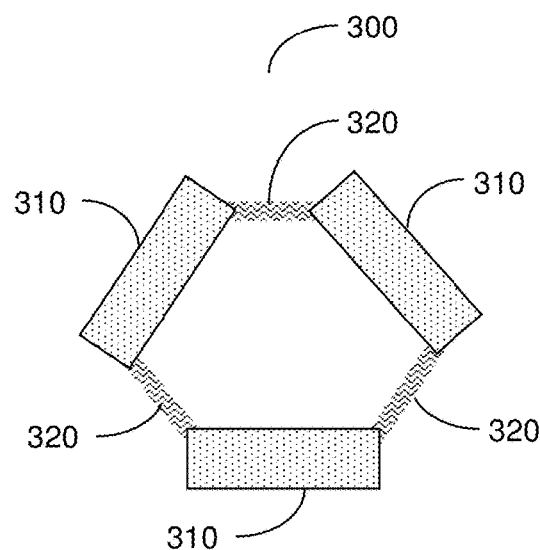
Figure 3D:
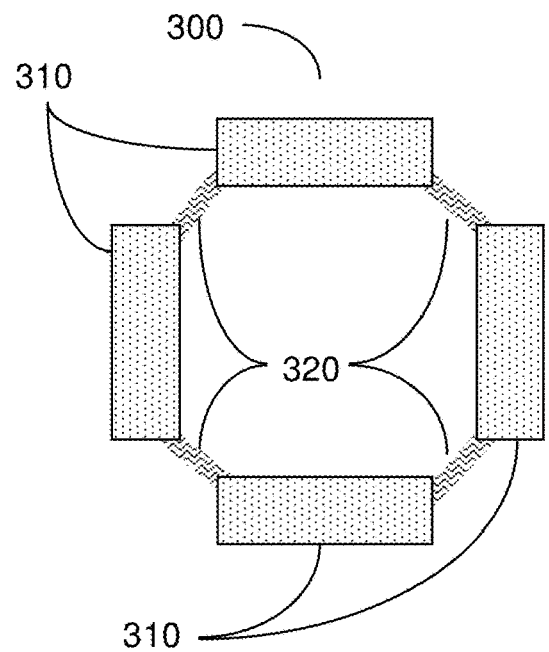
Figure 3E:
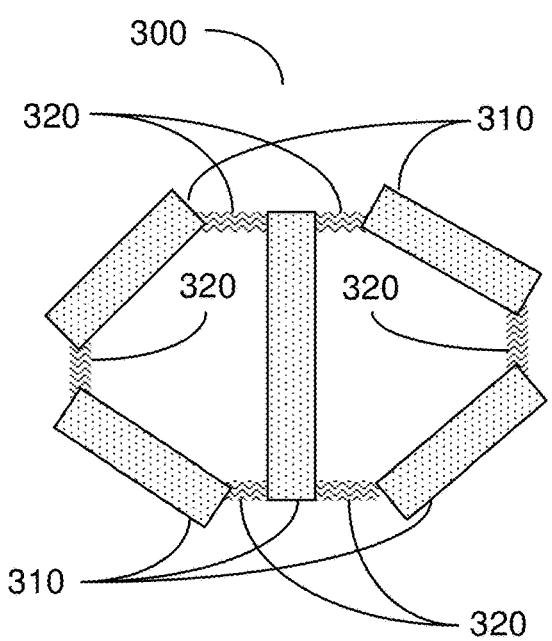

The geometrical and topological arrangement of the coil elements 310 can also be varied in further embodiments. For example, three coil elements 310 can be provided in a triangular configuration as illustrated in FIG. 3C. Alternatively, four coil elements 310 can be provided in a square, rectangular, trapezoidal, or other four-sided configuration as shown in FIG. 3D. In another embodiment, the coil elements 310 can be connected in an interlocking configuration as shown, e.g., in FIG. 3E.

The coil elements 310 can all be the same size and shape, and have the same radio frequency (RF) properties. In further embodiments, different ones of the coil elements 310 can have different sizes, shapes, and/or RF properties. The coil arrangement configurations shown in FIGS. 3A-3E are merely examples, and other configurations that combine coil elements 310 with variable spacers 320 can be used in further embodiments of the disclosure.

The variable spacers 320 can include conductive elements therein that conduct electrical signals (e.g., detected MR RF signals) from each coil element 310 through an external cable (not shown) to a transmitting/receiving module of the MRI apparatus (not shown). In further embodiments, the conductive elements in the variable spacers 320 can also be configured to conduct electrical signals between or among two or more of the coil elements 310. The variable spacers 320 can optionally include other electronic components that may be associated with MR imaging coils such as, e.g., resistors, capacitors and/or inductors. Such electronic components can also or alternatively be provided in the coil elements 310.

The variable spacers 320 are preferably structured to be deformable but sufficiently rigid and/or lockable to maintain a desired orientation among the coil elements 310. For example, the variable spacers 320 can be formed as deformable or bendable rods or tubes that can be bent to a desired shape through application of sufficient force, where such force can be applied manually by a user (e.g. using bare hands). The variable spacers 320 can be sufficiently stiff to maintain their shape when the coil arrangement 300 is picked up or moved. Conductive elements (e.g. wires) can be provided within a lumen of the variable spacers 320, and appropriate shielding of such conductors can optionally be provided.

In further embodiments, the variable spacers 320 can each include two or more slidably engaged rigid rail elements that facilitate relative movement of the ends of the coil structures 310 affixed to the rail elements. For example, in one embodiment the rail elements can be configured as concentric tubes having square or round cross sections, or cross sections of another shape. The rail elements can be provided with sufficient frictional resistance to facilitate manual positioning of the coil elements 310 in a desired geometry, while maintaining such particular geometry when the coil arrangement 300 is picked up or moved.

Figure 4A:
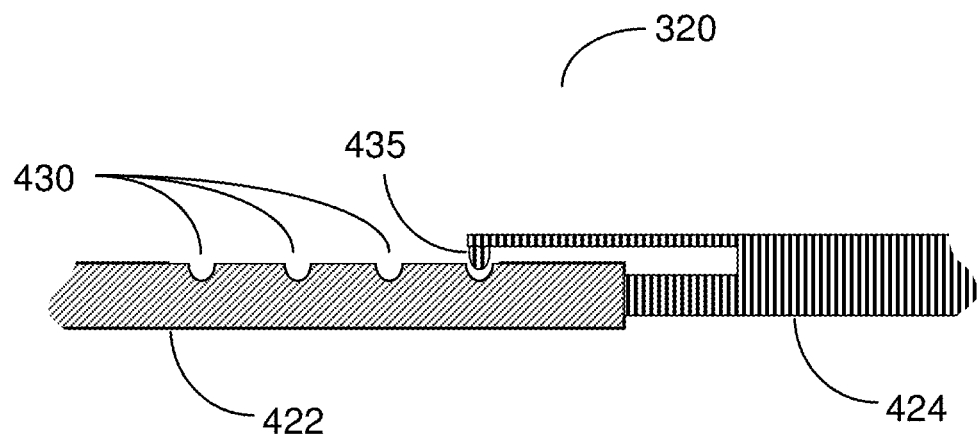
FIGS. 4A-4B are schematic illustrations of exemplary configurations for adjustable spacers connecting coil elements in accordance with embodiments of the present disclosure.

In a further embodiment, one or more of the variable spacers 320 can provided with a plurality of locking "stops" that can hold the variable spacers 320 at any one of several particular lengths. For example, as illustrated in FIG. 4A, one rail element 422 can be provided with a plurality of indentations or holes 430. A flexible protrusion 435 in the corresponding slidable rail element 424 can removably fit into the indentations or holes 430 to maintain a relative position of the two slidable rail elements 422, 424. Other adjustable locking position mechanisms that are known in other arts can also be used in further embodiments of the disclosure.

Figure 4B:
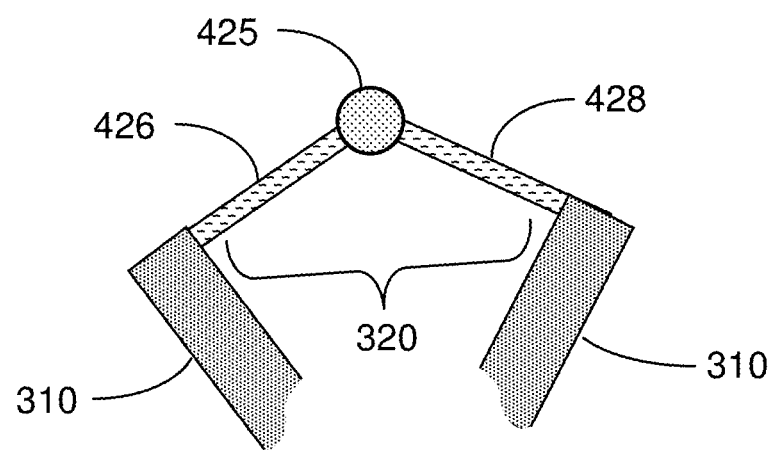

In a still further embodiment, illustrated in FIG. 4B, one or more of the variable spacers 320 can include two or more rigid segments 426, 428 that are pivotally or rotatably connected to one another by one or more frictional or lockable hinges 425. Such hinges 425 can be configured to maintain adjacent rail elements 426, 428 of the variable spacers 320 at any one of several orientations with respect to one another.

The coil configurations shown in FIGS. 3A-3E are typically substantially planar configurations. In further embodiments, the variable spacers 320 can be structured to allow a degree of out-of-plane deformation. For example, the variable spacers 320 can be deformable in an out-of-plane direction, or can be provided with hinges 425 that allow portions of the variable spacers 320 (and the coil elements 310) to be non-coplanar in the coil arrangement 300. Such adjustability can provide a coil arrangement 300 that can conform to a surface contour of the subject in the area being imaged.

In some embodiments, the variable spacers 320 can be rigidly coupled to the coil elements 310. In further embodiments, the variable spacers 320 can be pivotally or flexibly coupled to the coil elements 310 in any of the embodiments described herein, e.g., to facilitate arbitrary adjustment of the coil elements 310 with respect to one another. Such adjustable coupling can ensure that the coil arrangement 300 can be configured in any one of a variety of geometries using the variable spacers 320 and still remain structurally sound.

In certain embodiments, the variable spacers 320 can be provided with gauges, markings, or other length and/or angle indicators that quantify the specific configuration of the coil arrangement 300 being used for a particular procedure. Such geometrical indicators can be entered as data into a user console of the MRI system. The MRI system can be configured modify or adapt certain parameters of the MR imaging procedure based on these configurational parameters of the coil arrangement 300. Such adaptation of imaging parameters can, e.g., facilitate improved imaging of the subject prior to and/or during an intervention or other guided procedure by optimizing characteristics of the MR imaging sequences based on the specific configuration of the coil arrangement 300. Modifications of the imaging parameters can be programmed based on, e.g., calculations and/or known principles that relate coil array geometries to pulse and gradient sequences. The particular modifications to an MR imaging procedure can be based on, e.g., the properties of a specific coil arrangement 300 and the type of MR imaging procedure being used.

In a still further embodiment, the coil arrangement 300 can include sensors or other indicators that identify particular geometric configurations of the coil arrangement 300, e.g., by specifying the length, shape, and/or angle of one or more of the variable spacers 320. For example, if a variable spacer 320 includes slidably engaged segments with a plurality of locking positions, the spacer 320 can be structured to identify each of a plurality of predetermined positions/lengths using microswitches, strain gauges, a resistive arrangement (such as a rheostat or other variable resistor) or the like. Similarly, sensors can be used to detect a particular shape of a variable spacer 320, or a particular angle between adjacent segments 426,428 of a variable spacer 320 that are pivotally connected.

The configuration of one or more variable spacers 320 can be communicated to the MRI system, e.g., using a further conductive circuit. In another embodiment, the configuration of one or more variable spacers 320 can be communicated to the MRI system using conductors associated with the coil elements 310. The MRI system can be configured to detect such configuration information associated with the coil arrangement 300, and to automatically modify or adapt certain parameters of the MR imaging procedure based on these configurational parameters as described above. For example, the MRI system can be configured to detect the status of a plurality of microswitches that indicate the configuration of one or more variable spacers 320, or a resistance of a circuit if variable resistor elements are used to detect the configuration of the variable spacers 320. Such communication of the specific configuration of the coil arrangement 300, and optional modification of MR imaging parameters based on such detected configuration, can be performed after the coil arrangement 300 is shaped or adapted for a particular procedure, but prior to the actual intervention or MRI-guided procedure.

The exemplary coil arrangement 300 can thus provide one or more adjustable coil openings (e.g., the spaces between the coil elements 310). Such adjustability can provide one or more sufficiently large openings and corresponding sterile regions to facilitate any desired needle/object placement location and angle during an intervention, while providing openings that are not so large as to degrade imaging quality unnecessarily. Additionally, the coil arrangement 300 can be adaptable to a number of specific procedures and to different-sized subjects, thereby performing the function of a number of different non-adjustable coil arrangements. For example, a single coil arrangement 300 could be used for imaging both adult and pediatric subjects by adjusting the configuration.

In another embodiment of the disclosure, a coil arrangement 500 can be provided as illustrated schematically in FIGS. 5A-5B. The exemplary coil arrangement 500 includes a plurality of coil elements 510. At least one of the coil elements 510 is connected to the other coil elements 510 by connectors 520. The connectors 520 can include corresponding plugs and sockets, or other types of detachable fasteners. The connectors 520 can provide structural stability when the coil elements 510 are connected, as shown in FIGS. 5A and 5B. The connectors 520 can also include connective couplings for conductive leads that provide an electrically conductive path between the connected coil elements 510 and/or between the coil elements 510 and one or more conductive leads that connect the coil array 500 to the MRI apparatus (not shown in these figures).

The exemplary coil arrangement 500 shown in FIG. 5A includes 5 coil elements 510. This configuration can be used, e.g., to obtain a high-quality image dataset prior to the intervention for planning purposes. The central coil element 510 can then be removed prior to the intervention, as shown in FIG. 5B, to create a central opening for needle or object insertion. The removal of this center coil element 510 may result in a reduced quality of imaging during the intervention as compared to the coil arrangement configuration shown in FIG. 5A. Accordingly, a single coil arrangement 500 can be used for both high-quality pre-intervention imaging and for obtaining sufficient imaging quality during the intervention to guide the insertion procedure while providing necessary access to the subject through a central opening. The coil arrangement configurations shown in FIGS. 5A and 5B are merely examples, and other configurations that combine coil elements 510 with connectors 520 can be used in further embodiments of the disclosure.

Plugs 530 can be provided and configured to be inserted into the connectors 520 when one or more coil arrangements 510 are removed, as shown in FIG. 5B. Such plugs 530 can seal or protect the conductors within the connectors 520, and can also facilitate sterility of the region proximal to the coil arrangement 520 by providing a continuous closed surface when inserted into "empty" connectors. The plugs 530 can be made of silicone, plastic, or another comparable material.

In another embodiment, the MRI system being used with the coil arrangement 500 can be configured to detect particular configurations of the coil arrangement 500, e.g., which coil arrangements 510 are present and which are absent, prior to each MR imaging procedure. Such detection can be based on electrical properties of the coil arrangement 500, e.g., by sending an electrical signal to the coil arrangement 500 and detecting a resistivity, an overall inductance, or the like of the coil arrangement 500. The MRI system can be further configured to automatically modify or adapt certain parameters of the MR imaging procedure based on the specific configuration of the coil arrangement 500, as described above. Such detection of the specific configuration of the coil arrangement 500 and modification of MR imaging parameters can be performed prior to each imaging procedure to optimize the image data based on the coil arrangement properties.

In another exemplary configuration shown in FIGS. 6A and 6B, the coil elements 510 can be provided as circular elements. Conductors connecting the coil elements 510 to the MRI system are shown in these figures. In FIG. 6A, the coil arrangement 600 includes three circular coil elements 510. This configuration can be used to obtain high-quality image data for planning a guided procedure or intervention. In FIG. 6B, the center coil element 510 has been removed to provide a central opening to facilitate guided insertion of a needle or other object. An optional plug 530 has been placed over the empty connector 520 after the corresponding coil element 510 was removed. In this example, with equal-sized coil elements 510, the 3-element configuration shown in FIG. 6A will provide a signal-to-noise ratio (SNR) that is about 1.4 times greater than that of the 2-element configuration shown in FIG. 6B. Such compromise in image quality during the intervention can be minimized in the exemplary coil arrangement 600 based on the size of the accessible sterile field needed for a particular MR-guided procedure. The coil arrangement configurations shown in FIGS. 6A and 6B are merely examples, and again, other configurations that combine coil elements 510 with connectors 520 can be used in further embodiments of the disclosure.

Accordingly, embodiments of the present disclosure can provide coil arrangements that can be used to obtain high-quality image datasets for planning and placement verification of an MR-guided procedure, and also be adapted to provide coil openings that are optimal with respect to image quality during a guided procedure, e.g., that are no larger than necessary for the procedure. Such adaptive coil arrangements can improve safety of the procedure by facilitating continuous visualization of needles, targets, and surrounding structures. They can also improve workflow as compared to using a standard diagnostic coil, because a single coil arrangement can be used for high-quality imaging for planning and to provide a coil opening that is adapted to the required sterile field size.

The foregoing merely illustrates the principles of the present disclosure. Various modifications and alterations to the described embodiments will be apparent to those skilled in the art in view of the teachings herein. It will thus be appreciated that those skilled in the art will be able to devise numerous techniques which, although not explicitly described herein, embody the principles of the present disclosure and are thus within the spirit and scope of the present disclosure.

What is claimed is:

1. A coil arrangement for use with a magnetic resonance imaging system, comprising:
   a plurality of coil elements; and
   a plurality of connecting arrangements,
   wherein each of the plurality of connecting arrangements is coupled to at least one of the plurality of coil elements,
   wherein each of the plurality of connecting arrangements is configured to provide at least one of a mechanical connection and an electrically conductive connection between at least two of the coil elements, and wherein the coil arrangement is configurable to provide at least one user-determined opening size within the coil arrangement, and
wherein the coil arrangement comprises at least three coil elements, and wherein at least one of coil elements is configured to be detached from the coil arrangement to provide a modified coil arrangement.

2. The coil arrangement of claim 1, wherein at least one of a length or a shape of at least one of the plurality of connecting arrangements is user-adjustable.

3. The coil arrangement of claim 1, wherein at least one of the connecting arrangements is rigidly coupled to at least one of the coil elements.

4. The coil arrangement of claim 1, wherein at least one of the connecting arrangements is flexibly coupled to at least one of the coil elements.

5. The coil arrangement of claim 1, wherein at least one of the plurality of connecting arrangements is manually deformable.

6. The coil arrangement of claim 1, wherein at least one of a length or a shape of at least one of the plurality of connecting arrangements is adjustable.

7. The coil arrangement of claim 1, wherein at least one of the plurality of connecting arrangements comprises a plurality of slidably coupled rigid segments.

8. The coil arrangement of claim 7, wherein the plurality of slidably coupled rigid segments are configured with a plurality of mechanical stops that facilitate adjustment of the at least one connecting arrangement to any one of a plurality of predetermined lengths.

9. The coil arrangement of claim 1, wherein at least one of the plurality of connecting arrangements comprises a plurality of pivotally coupled segments.

10. The coil arrangement of claim 9, wherein at least two of the plurality of pivotally coupled segments are coupled by at least one hinge arrangement, wherein the hinge arrangement is configured to maintain the at least two pivotally coupled segments at any one of a plurality of predetermined angles with respect to one another.

11. The coil arrangement of claim 1, wherein the coil arrangement comprises two coil elements.

12. The coil arrangement of claim 1, wherein the coil arrangement comprises three coil elements.

13. The coil arrangement of claim 1, wherein the coil arrangement comprises four coil elements.

14. The coil arrangement of claim 1, wherein the coil arrangement comprises more than four coil elements.

15. The coil arrangement of claim 1, wherein at least one of the plurality of connecting arrangements comprises at least one sensor configured to detect a particular geometrical configuration of the at least one connecting arrangement.

16. The coil arrangement of claim 15, wherein the at least one sensor comprises at least one of a strain gauge, a variable resistor, and an electrical switch.

17. An MRI system comprising:
a coil configuration detecting arrangement,
wherein the coil configuration detecting arrangement configured to detect a particular geometrical configuration of a coil arrangement that is connected to the MRI system,
wherein the coil arrangement comprises a plurality of coil elements and a plurality of connecting arrangements,
wherein each of the plurality of connecting arrangements is coupled to at least one of the plurality of coil elements,
wherein each of the plurality of connecting arrangements is configured to provide at least one of a mechanical connection and an electrically conductive connection between at least two of the coil elements, and
wherein the coil arrangement is configurable to provide at least one user-determined opening size within the coil arrangement.

18. The MRI system of claim 15, wherein the MRI system is further configured to select at least one parameter of an imaging procedure based on the detected geometrical configuration of the coil arrangement.

* * * * *

UNITED STATES PATENT AND TRADEMARK OFFICE
CERTIFICATE OF CORRECTION

PATENT NO. : 10,209,325 B2
APPLICATION NO. : 15/056134
DATED : February 19, 2019
INVENTOR(S) : Eva Rothgang et al.

Page 1 of 1

It is certified that error appears in the above-identified patent and that said Letters Patent is hereby corrected as shown below:

In the Specification

In Column 1, prior to the Field of the Disclosure, please insert the following language:
--STATEMENT REGARDING FEDERALLY SPONSORED RESEARCH OR DEVELOPMENT
This invention was made with government support under EB007829 awarded by the National Institutes of Health. The government has certain rights in the invention.--

Signed and Sealed this
Nineteenth Day of May, 2020

Andrei Iancu
*Director of the United States Patent and Trademark Office*